(12) United States Patent
Hantschel et al.

(10) Patent No.: US 11,035,880 B2
(45) Date of Patent: Jun. 15, 2021

(54) METHOD FOR PRODUCING A PROBE SUITABLE FOR SCANNING PROBE MICROSCOPY

(71) Applicants: IMEC VZW, Leuven (BE); Katholieke Universiteit Leuven, KU LEUVEN R&D, Leuven (BE)

(72) Inventors: Thomas Hantschel, Houtvenne (BE); Thijs Boehme, Kessel-Lo (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 16/802,944

(22) Filed: Feb. 27, 2020

(65) Prior Publication Data
US 2020/0278379 A1 Sep. 3, 2020

(30) Foreign Application Priority Data
Mar. 1, 2019 (EP) .................................... 19160202

(51) Int. Cl.
*G01Q 70/14* (2010.01)
*G01Q 70/06* (2010.01)
(Continued)

(52) U.S. Cl.
CPC ............ *G01Q 70/14* (2013.01); *G01Q 70/06* (2013.01); *G01Q 10/045* (2013.01); *G01Q 60/02* (2013.01)

(58) Field of Classification Search
CPC .... G01Q 70/14; G01Q 70/06; G01Q 710/045; G01Q 60/02
(Continued)

(56) References Cited

U.S. PATENT DOCUMENTS 5,010,249 A * 4/1991 Nishikawa ............. G01Q 70/14
216/11
5,221,415 A 6/1993 Albrecht et al.
(Continued)

FOREIGN PATENT DOCUMENTS

| DE | 102010035931 A1 | 3/2012 |
| EP | 2458391 A1 | 5/2012 |
| WO | 2009012180 A1 | 1/2009 |

OTHER PUBLICATIONS

("Diamond-Modified AFM Probes: From Diamond Nanowires to Atomic Force Microscopy-Integrated Boron-Doped Diamond Electrodes", Analytical Chemistry 2011, 83, pp. 4936-4941 (Year: 2011).*
(Continued)

*Primary Examiner* — Nicole M Ippolito
(74) *Attorney, Agent, or Firm* — McDonnell Boehnen Hulbert & Berghoff LLP (57) ABSTRACT

Example embodiments relate to methods for producing a probe suitable for scanning probe microscopy. One embodiment includes a method for producing a probe tip suitable for scanning probe microscopy. The method includes producing a probe tip body that includes at least an outer layer of a probe material. The method also includes, during the production of the probe tip body or after the production, forming a mask layer on the outer layer of probe material. Further, the method includes subjecting the probe tip body to a plasma etch procedure. The mask layer acts as an etch mask for the plasma etch procedure. The plasma etch procedure and the etch mask are configured to produce one or more tip portions formed of the probe material. The one or more tip portions are smaller and more pointed than the probe tip body prior to the plasma etch procedure.

10 Claims, 6 Drawing Sheets

(51) Int. Cl.
   *G01Q 10/04* (2010.01)
   *G01Q 60/02* (2010.01)
(58) Field of Classification Search
   USPC .................. 850/52, 55, 56, 57, 58, 59, 60
   See application file for complete search history.

(56) References Cited

U.S. PATENT DOCUMENTS

| | | |
|---|---|---|
| 6,328,902 B1 | 12/2001 | Hantschel et al. |
| 6,756,584 B2 | 6/2004 | Hantschel et al. |
| 8,484,761 B2 | 7/2013 | Hantschel et al. |
| 2005/0279729 A1* | 12/2005 | Okulan .................. G01Q 60/38 216/11 |

OTHER PUBLICATIONS

Smirnov et al. ("Diamond-Modified AFM Probes: From Diamond Nanowires to Atomic Force Microscopy-Integrated Boron-Doped Diamond Electrodes", Analytical Chemistry 2011, 83, pp. 4936-4941, from hereinafter "Smirnov") (Year: 2011).*
Smirnov, Waldemar, Armin Kriele, René Hoffmann, Eugenio Sillero, Jakob Hees, Oliver A. Williams, Nianjun Yang, Christine Kranz, and Christoph E. Nebel. "Diamond-modified AFM probes: from diamond nanowires to atomic force microscopy-integrated boron-doped diamond electrodes." Analytical chemistry 83, No. 12 (2011): 4936-4941.
European Search Report and Written Opinion, European Patent Application No. 19160202.8, dated Aug. 9, 2019, 9 pages.

* cited by examiner

METHOD FOR PRODUCING A PROBE SUITABLE FOR SCANNING PROBE MICROSCOPY

CROSS-REFERENCE TO RELATED APPLICATIONS

The present application is a non-provisional patent application claiming priority to European Patent Application No. EP 19160202.8, filed Mar. 1, 2019, the contents of which are hereby incorporated by reference.

FIELD OF THE DISCLOSURE

The present disclosure relates to probes suitable for scanning probe microscopy (SPM) techniques such as atomic force microscopy (AFM) or scanning spreading resistance microscopy (SSRM).

BACKGROUND

An SPM probe includes an elongate strip attached at one end to a holder and carrying at its other end a tip. The strip is referred to as the cantilever of the probe, while the tip may be a pyramid-shaped body placed onto the plane of the cantilever as illustrated for example in document U.S. Pat. No. 5,221,415, thereby pointing in a direction essentially perpendicular to the cantilever. Alternatively the tip may extend in the plane of the cantilever, as illustrated for example in document U.S. Pat. No. 8,484,761, or the tip may extend from the cantilever at an angle between 0 and 90 degrees. During an SPM acquisition, the tip is placed in contact to or in close proximity with a surface and the probe is scanned along a given trajectory, usually a set of parallel lines. The interaction between the tip and the surface is translated into topographical, electrical or magnetic data of the surface, or into signals related to the composition of a sample, depending on the characteristics of the tip. The probe may be in continuous contact with the surface under investigation, or an intermittent contact mode may be applied, wherein the surface characteristics are measured by detecting changes in the impedance (electrical or other) of the probe-surface connection. A contactless mode is equally applicable, when the interaction between the probe and the surface is dominated by non-contact forces such as Vanderwaals forces.

Various materials have been proposed for the fabrication of the tip and the cantilever. Full diamond tips and diamond coated tips may be used due to the mechanical and electrical characteristics of the diamond probe material. The dimensions of the apex area of the tip determine the resolution of the acquisitions. Pyramid-shaped tips and in-plane tips are available which allow the imaging and characterization of nano-scaled surface features. However for emerging sub-10 nm technology nodes, the aspect ratio of currently available tips is becoming too low. While a "tip-on-tip" structure may be produced, for example from document U.S. Pat. No. 6,328,902, thereby increasing the aspect ratio of the tip, the methods available for producing such a structure are technically complex.

SUMMARY

The disclosure aims to provide a technically straightforward method for producing a probe tip with increased aspect ratio. The disclosure relates to the methods as disclosed in the appended claims, and to probe tips produced by these methods.

According to some embodiments, one or more smaller tip portions are produced on the larger tip body of a probe suitable for SPM, after the production of the probe tip body as such. The smaller tip portions are nano-sized tips whereas the dimensions of the tip body are in the order of micrometers. The probe tip body may be produced according to any standard technique, for example by filling a mold with a probe material such as diamond. The creation of the smaller tip portions is realized by a self-aligned plasma etch procedure, using a mask layer on the outer surface of the probe tip body. The mask layer may include nano-sized particles and/or compounds formed spontaneously on the outer surface of the tip body or of the mold, such as oxides or oxycarbides. The nano-sized particles may be seed particles deposited in the mold prior to the deposition of the probe material therein, and/or particles produced during the etch process itself, such as particles sputtered from the cantilever or from the reaction chamber in which the etch process is performed. Alternatively or in addition, masking particles may be deliberately deposited on the tip body prior to the etch procedure.

The disclosure is in particular related to a method for producing a probe tip suitable for scanning probe microscopy (SPM), including the steps of:

Producing a probe tip body that includes at least an outer layer of a probe material, During the production process of the probe tip body and/or after the production process, forming a mask layer on the outer layer of probe material, subjecting the probe tip body to a plasma etch procedure, wherein the mask layer acts as an etch mask for the etching of the probe material, and wherein the etch procedure and the etch mask are configured to produce one or more tip portions formed of the probe material, the one or more tip portions being considerably smaller and more pointed than the tip body prior to the etch procedure.

According to an embodiment, the mask layer includes a layer of irregular thickness formed prior to the etch procedure, wherein the layer of irregular thickness acts as an etch mask for the etching of the probe material.

The layer of irregular thickness may include compounds formed spontaneously, e.g. by oxidation, on the surface of the tip body after the production process of the tip body and prior to the etch procedure.

The layer of irregular thickness may include particles deposited deliberately on the tip body after the production process of the tip body and prior to the etch procedure.

According to an embodiment, the tip body is produced by producing a mold in a substrate and by depositing the probe material in the mold, wherein seed particles are deposited in the mold prior to depositing the probe material therein, and wherein the layer of irregular thickness includes the seed particles.

According to an embodiment, the layer of irregular thickness further includes compounds formed spontaneously on the surface of the mold.

According to an embodiment, the etch rate of the layer of irregular thickness is considerably lower than the etch rate of the probe material.

According to an embodiment, the etch procedure includes:

A first etch process performed during a first brief etch time and configured to produce craters in the layer of irregular thickness, A second etch process performed during a second etch time that is considerably longer than the first etch time, and configured to produce the one or more tip portions.

According to an embodiment, the probe tip body is attached to a cantilever and particles of the cantilever material are sputtered during the etch procedure, and deposited onto the probe tip body, wherein the sputtered particles from the cantilever contribute to the formation of the mask layer during the remainder of the etch procedure.

According to an embodiment, the plasma etch procedure takes place in an etch chamber and particles from materials inside the chamber are sputtered during the etch procedure, and deposited onto the probe tip body, wherein the sputtered particles from the materials inside the chamber contribute to the formation of the mask layer during the remainder of the etch procedure.

According to an embodiment, polymeric etch residues produced during the etch procedure are deposited onto the probe tip body, wherein the etch residues contribute to the formation of the mask layer during the remainder of the etch procedure.

According to an embodiment, the etch procedure includes multiple etch steps performed under different plasma conditions and during different etch times.

At the end of the etch procedure, the tip portions may be distributed across the totality of the tip body. According to another embodiment, the tip body is pyramid-shaped and at the end of the etch procedure, one or more tip portions are present on the apex area of the tip body and no tip portions are present on the side planes of the tip body, through one or a combination of the following effects:

a higher concentration of masking particles is deposited on the apex area than on the side planes, during the etch procedure, the tip body includes a core and on the core a layer of the probe material, and the thickness of the layer is higher on the apex area than one the side planes, so that at the end of the etch procedure, the probe material is removed from the side planes.

According to an embodiment, the etch procedure consists of a single etch process using the same plasma gas or the same mixture of plasma gases throughout the process.

The probe material may be diamond. According to another embodiment the probe material is TiN.

Example methods may further include the following steps performed after the etch procedure:

Depositing a capping layer on the one or more tip portions, thereby covering the tip portion or portions entirely, Subjecting the tip portions to a plasma etch process, configured to remove the capping layer from a tip area of the one or more tip portions, the tip area including the apex of the one or more tip portions, while substantially maintaining the cap layer around the lateral surface of the one or more tip portions.

The disclosure equally relates to a probe tip suitable for scanning probe microscopy (SPM), including a probe tip body that includes at least an outer layer of a probe material, wherein a plurality of tip portions formed of the probe material are distributed across the totality of the tip body, the tip portions being considerably smaller and more pointed than the tip body.

According to an embodiment, the tip portions include a capping layer on their outer surface except on a tip area of the tip portions, the tip area including the apex of the tip portions.

The disclosure is also related to a probe tip suitable for scanning probe microscopy (SPM), including a probe tip body having an apex area and including one or more tip portions on the apex area of the tip body, and no tip portions on the remainder of the tip body, the tip portions being considerably smaller and more pointed than the tip body, wherein the tip portions include a capping layer on their outer surface except on a tip area of the tip portions, the tip area including the apex of the tip portions.

The disclosure is also related to a probe including a cantilever, a holder to which the cantilever is attached, and a probe tip attached to a distal end of the cantilever, wherein the probe tip is a probe tip according to example embodiments.

DETAILED DESCRIPTION

Figure 1A:
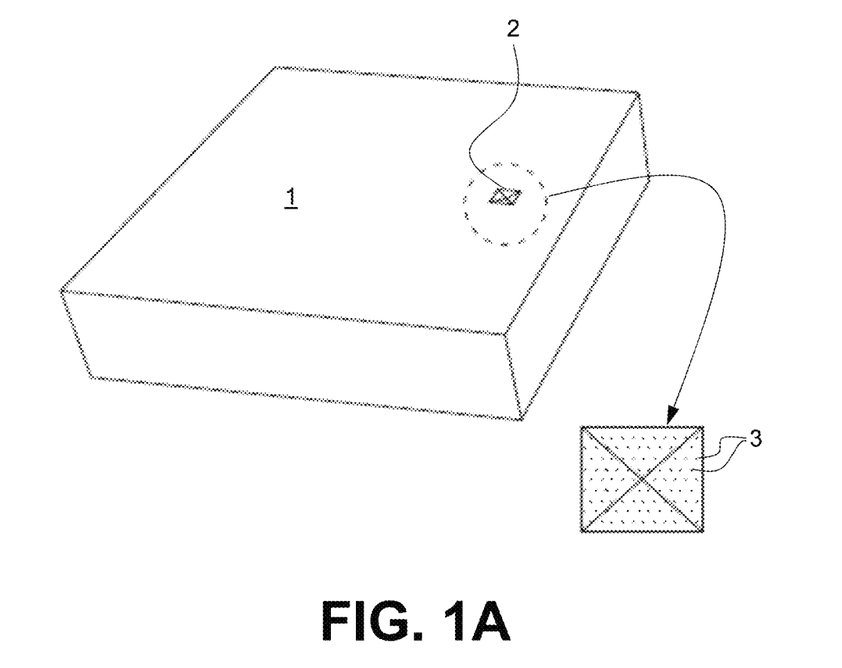
FIG. 1A illustrates a method where the probe is produced by a molding technique, according to example embodiments.

Example methods are described in detail for the case of a diamond probe tip produced by a molding technique. The method is however applicable to tips formed of other materials and produced by other techniques. FIG. 1A shows a silicon substrate 1 wherein a pyramid-shaped mold 2 is produced. This is typically done by anisotropic wet etching along the crystallographic planes of the substrate. This is achievable for example when the substrate 1 is a (100) oriented Si substrate, by wet etching the substrate in a square opening while the rest of the substrate is protected by a mask. The dimensions of the mold are in the order of micrometers, for example the sides of the mold may be about 5 to 10 micrometer long and the depth of the mold may be in the same order of magnitude. Nano-sized diamond seed particles 3 are then deposited in the mold, as schematically illustrated in the detail image included in FIG. 1A, which shows a top view of the mold. The seed particles enable the subsequent growth of a diamond layer in the mold. As is understood, the deposition of the seed particles may be done by immersion seeding, wherein the substrate 1 including the mold 2 is immersed into a colloidal solution of the particles in a solvent such as ethanol or $H_2O$. The potential of these diamond nanoparticles is adjusted to be opposite of the potential of the Si substrate which results into attraction and finally deposition of these diamond nanoparticles onto the Si surface. The detail image shows the particles being evenly distributed in straight arrays, but in reality the particles are distributed more randomly.

According to this particular embodiment, at least a portion of these particles are non-doped diamond particles. The density of the particles when deposited in the mold may be in accordance with existing methods, for example between $1E10/cm^2$ and $5E10/cm^2$. The density may however be controlled within a larger range of $1E9/cm^2$ and $1E11/cm^2$ by adjusting the seeding dispersion chemistry, the particle and substrate potential and the seeding time. The applied density may enable the growth of a closed (i.e. fully coalesced) diamond layer in the mold. According to an embodiment, the particles consist of a mixture of non-doped diamond particles and doped diamond particles, deposited at any of the above-described densities. Both the doped and non-doped particles enable the growth of a closed diamond layer, but only the non-doped particles will act later on as masks for the creation of the nano-tips in accordance with example embodiments. The diameter of the individual particles is typically 3 to 5 nm but they often cluster to aggregates leading to a size distribution of typically 5 to 25 nm.

Figure 1B:
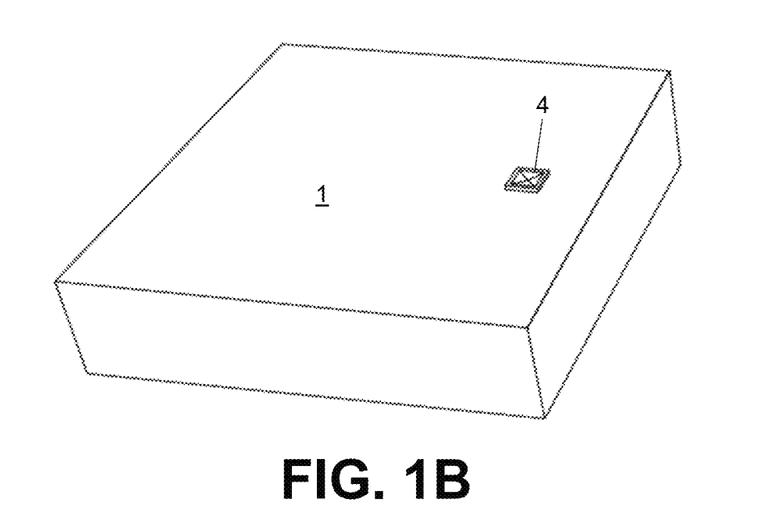
FIG. 1B illustrates a method where the probe is produced by a molding technique, according to example embodiments.

A doped diamond layer is then deposited for example by chemical vapor deposition (CVD). The dopant may be boron. The diamond layer is deposited in the mold 2 and on the surface of the substrate 1, after which it is patterned to form a patch 4 of the diamond layer inside and around the mold, as shown in FIG. 1B. The cavity of the mold is thus not fully filled with diamond, but a layer of diamond is deposited on the inverted pyramid surfaces of the mold. The thickness of the diamond layer may vary according to the desired probe characteristics. Diamond layers of about 1 micrometer thick are often used, but thinner layers are possible, for example about 100 nm. It is also possible to produce a full diamond tip by filling the entire mold with diamond.

Figure 1C:
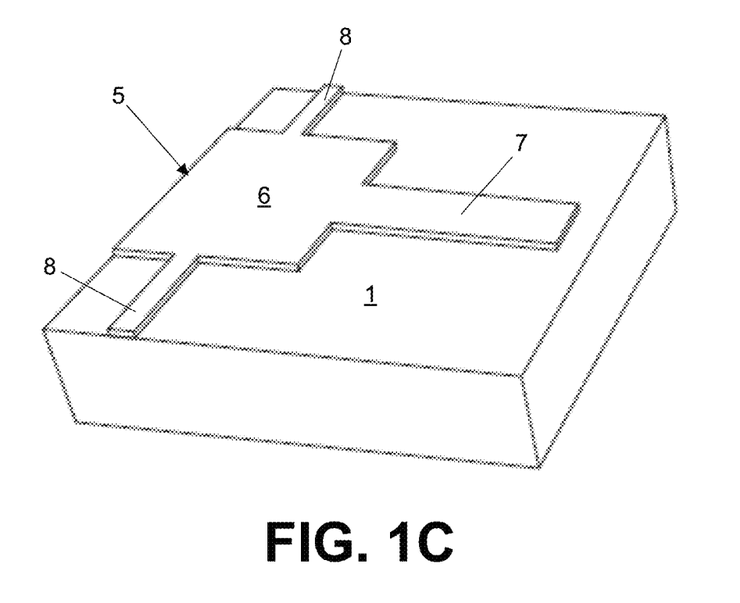
FIG. 1C illustrates a method where the probe is produced by a molding technique, according to example embodiments.
Figure 1D:
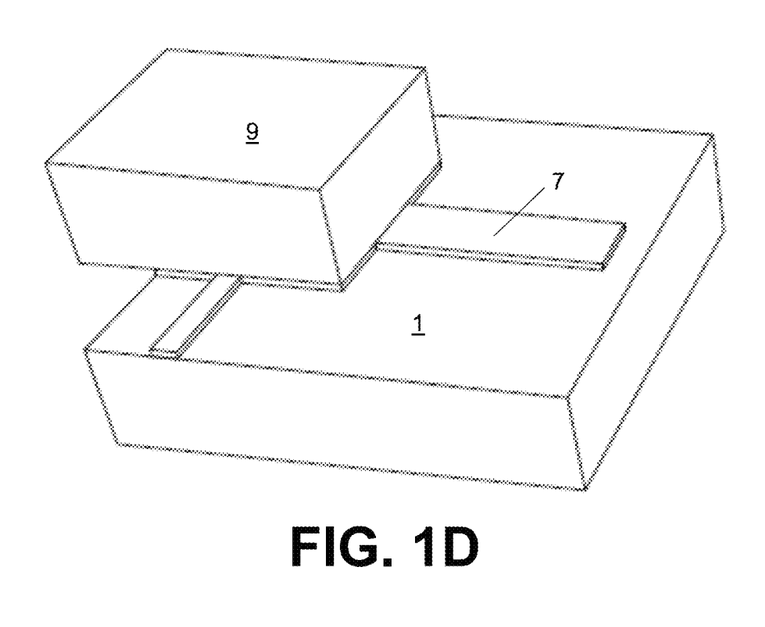
FIG. 1D illustrates a method where the probe is produced by a molding technique, according to example embodiments.

The diamond deposition is followed by the deposition and patterning of a metal layer stack 5 as illustrated in FIG. 1C. This may for example be a combination of TaN (about 50 nm) acting as adhesion and peel-off layer, Cu (about 50 nm) as seed layer for Ni electroplating, and Ni as cantilever material (about 5 microns). The metal fills the remainder of the mold cavity, so that this cavity is eventually filled by a solid tip formed of a metal core with a diamond layer on it. The patterning of the metal is done so that a base portion 6 is formed, with a cantilever 7 extending outward from the base portion 6. The distal end of the cantilever covers the diamond patch 4. Lateral arms 8 which extend outward on both sides of the base portion 6 may be included for facilitating the release of the probe. The cantilever 7 and the tip inside the mold are subsequently under-etched and the base portion 6 is slightly peeled away from the substrate, overcoming the adhesion of the peel-off layer. A silicon holder chip 9 is then attached to the base portion 6, as shown in FIG. 1D, and the assembly is taken away from the substrate, resulting in the finished probe shown in FIG. 1E. At the distal end of the cantilever 7 is a pyramid-shaped tip body 10 having a Ni core and a diamond layer at the exterior of the pyramid and at the tip, with a ground plane 11 also formed of diamond and extending around the tip body 10. The ground plane 11 is embedded in the material of the cantilever 7. The parameters of the above-described method steps are standard and not described here in more detail. Any standard technique for realizing the above steps may be used in the method. Details of the under-etch and peel-off process are for example described in document U.S. Pat. No. 6,756,584.

Figure 1E:
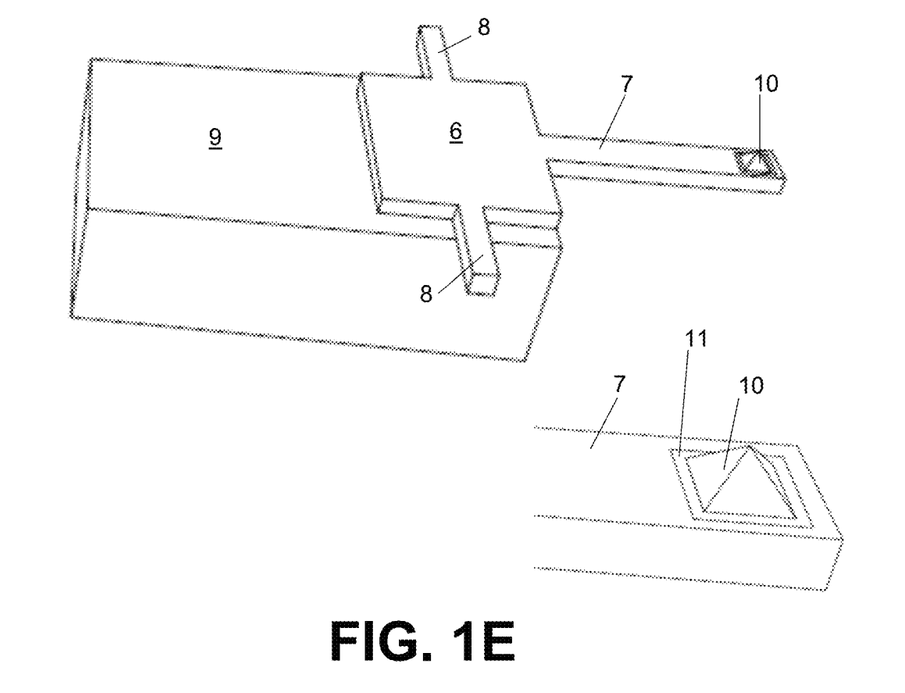
FIG. 1E illustrates a method where the probe is produced by a molding technique, according to example embodiments.

The method step that characterizes this embodiment of the method is a step that is added to the above-described fabrication. The probe as shown in FIG. 1E is subjected to a plasma etch procedure. This may be Reactive Ion Etching (ME) or Inductive Coupled Plasma (ICP) etching, configured so that the non-doped diamond nanoparticles 3 have a lower etch rate than the doped diamond of the tip body 10. This means that the particles are etched slower than the doped diamond layer, i.e. the particles act as an etch mask for the etching of the doped diamond. A suitable etch process having this effect is a plasma etch using $O_2$ as the plasma gas, hereafter referred to as $O_2$-plasma, and well-understood (an example of suitable parameters is given further in this description). Furthermore, at the beginning of the process of growing diamond in the Si mold, a thin (typically 1-5 nm thick) silicon oxycarbide layer is spontaneously formed with a non-uniform thickness. Silicon oxycarbide is the compound $SiO_xC_y$, with x<2 and y>0. Like the non-doped particles 3, the $SiO_xC_y$ layer is etched slower by an $O_2$ plasma etch than the doped diamond, i.e. the $SiO_xC_y$ also acts as an etch mask.

Figure 2A:
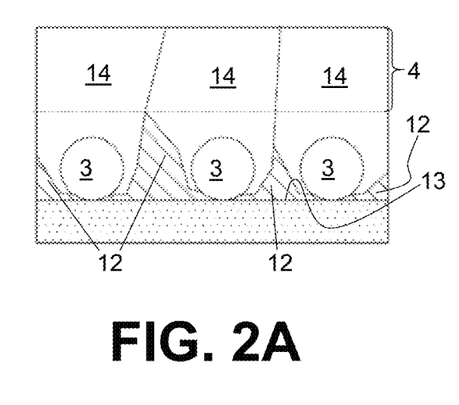
FIG. 2A illustrates the appearance of the $SiO_xC_y$ layer formed at the beginning of diamond growth in a silicon mold, according to example embodiments.
Figure 2B:
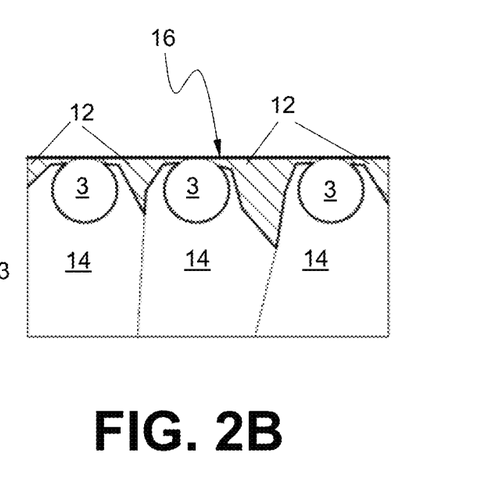
FIG. 2B illustrates the appearance of the $SiO_xC_y$ layer formed at the beginning of diamond growth in a silicon mold, according to example embodiments.

As illustrated in FIG. 2A, the $SiO_xC_y$ layer 12 is formed on the mold surface 13, in the spaces between adjacent seed particles 3, and grows thicker until the space in between the growing doped diamond islands 14 is closed and a fully coalesced diamond film 4 is formed. The outer surface of the probe after its release from the mold is shown in FIG. 2B. The $SiO_xC_y$ layer 12 together with the nanoparticles 3 form a layer 16 of irregular thickness, visualized by the bold lines in FIG. 2B. When this tip is subjected to $O_2$-plasma etching, the $SiO_xC_y$ portions 12 and the nanoparticles 3 are slowly etched away, until parts of the doped diamond layer 4 become exposed. This happens locally due to the irregularity of the thickness of layer 16. At these locations, doped diamond is etched at a higher speed than the $SiO_xC_y$ 12 and the seed particles 3. As the $O_2$ etch process continues, sharp nano-sized doped diamond tip portions 15, hereafter also referred to as nanotips, are formed in the diamond layer 4, resulting in a "hedgehog" tip structure illustrated in FIG. 3A. The nanotips 15 are distributed on the totality of the pyramid-shaped tip body 10 and on the diamond ground plane 11 around the tip body.

Figure 2C:
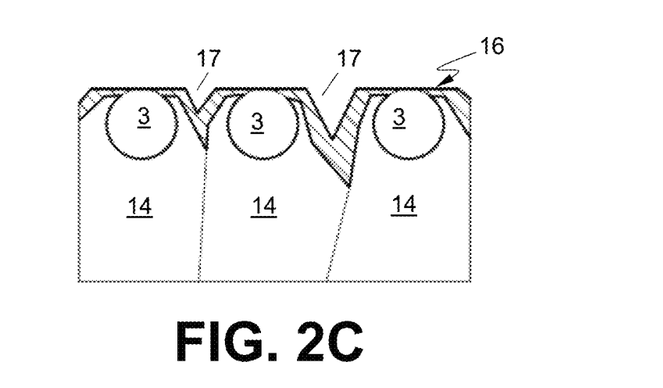
FIG. 2C illustrates the appearance of the $SiO_xC_y$ layer formed at the beginning of diamond growth in a silicon mold, according to example embodiments.
Figure 3A:
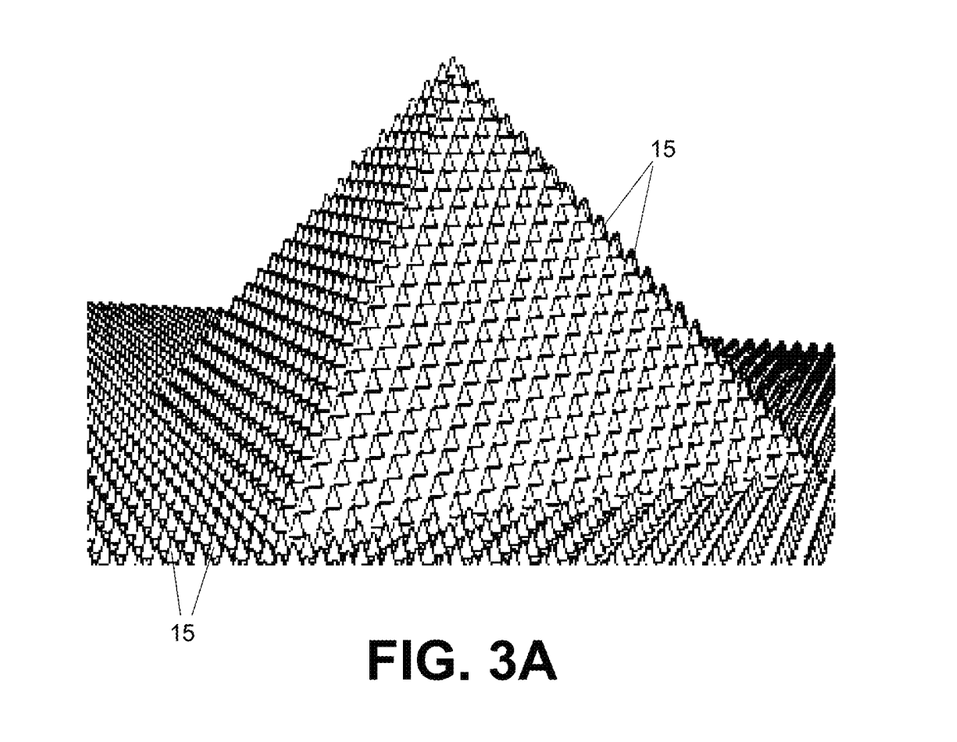
FIG. 3A illustrates the result of the method when nano-sized tip portions are distributed across the entire tip body, for the case of a pyramid-shaped tip body, according to example embodiments.

According to another etch procedure capable of obtaining the structure shown in FIG. 3A, the tip is first subjected to a short plasma etch using $SF_6$ or a mixture of $SF_6$ and $O_2$ as the plasma gas, for example for about 20 s. This short "flash" etch creates craters 17 in the $SiO_xC_y$ layer 12, as illustrated in FIG. 2c. This step is followed by an $O_2$ plasma etch as described above. The prior removal of a portion of the $SiO_xC_y$ leads to a quicker exposure of the doped diamond layer 4, so that the "hedgehog" structure of FIG. 3A is obtained in an overall shorter timespan.

Apart from the $SiO_xC_y$ layer 12 and the seed particles 3 acting as an etch mask, a third masking effect may occur during the plasma etch procedure itself. The energy of the plasma may release particles from materials inside the etch chamber and/or from the cantilever by sputtering, wherein the particles are deposited on the tip where they can also act as an etch mask for a given etch recipe. Also, polymeric etch residues deposited on the tip during the etch process may have the masking effect. In the particular case of a diamond tip produced by the above described molding technique on a Ni-cantilever, the sputtering of Ni particles from the cantilever may become an important contributor to the formation of the nanotips 15. Ni-particles are released from the cantilever by sputtering under the influence of the ion bombardment generated by $O_2$, $SF_6$ or $SF_6/O$ plasma. Also because of the bombardment with ions from the plasma, the pyramid gains static charge, resulting in an electric field, which attracts the Ni-particles. The Ni-particles are thereby deposited on the pyramid, but Ni is essentially not etched by $SF_6$ nor by $O_2$ plasma, so that the Ni-particles are also acting as etch masks in the same way as the seed particles 3 and $SiO_xC_y$ layer portions 12. The field is stronger where the surface is sharper, i.e. at the pyramid plane edges and mostly at the apex, so the concentration of Ni-particles is higher in these areas, which may be exploited for the production of specific tip structures (see further). When the dry etch is stopped sufficiently early, i.e. before etching away the nanotips 15 themselves, the three above-described masking effects, the $SiO_xC_y$ 12, the seed particles 3 and the Ni-particles have the combined effect of producing the "hedgehog" structure illustrated in FIG. 3A. The $SiO_xC_y$ and seed particle effects are more important at the start of the etch process, and may be the dominant processes in the case of thin diamond layers, e.g. about 100 nm. For thicker diamond layers, e.g. 1 micrometer, or full diamond tips, all three effects contribute to the formation of the nanotips 15 and the Ni-sputtering effect will become dominant after the $SiO_xC_y$ and the seed particles have been etched away.

As stated, all three masking effects (seed particles 3, $SiO_xC_y$ layer 12 and sputtered particles or etch residues) may contribute to the formation of the "hedgehog" structure in the case of diamond tip produced in a Si mold on a Ni cantilever. For tips produced from other materials and/or in molds of other materials, or by fabrication techniques other than the molding technique, not all the above-described effects are necessarily occurring simultaneously. In an example method, any one of the above masking effects may occur alone or in combination with the others. If the cantilever material is not a suitable etch mask, the sputtering effect is not or less relevant. It is also possible that a layer similar to the $SiO_xC_y$ is not formed, or does not have a masking effect. The presence of seed particles in a mold is not always required, as is the case for a TiN probe tip, see further. On the other hand, particles which are to serve as a mask in the etch procedure may be deposited onto the tip body 10 after the probe fabrication process and prior to the etching procedure. For example, non-doped diamond particles may be deposited onto a diamond tip by colloidal deposition. This may be done in addition to one or more of the above-described masking effects, or when these effects are not applicable, for example when the seed particles are not suitable as a mask in a particular etching chemistry, or when the probe is not produced by a molding technique. It is also possible that the masking effect is only due to particles deposited on the tip during the etch procedure, such as sputtered particles from the cantilever or from the etch chamber. This may be the case when no seed particles are present and the spontaneously formed compounds, e.g. oxides do not have the masking effect.

In the light of the above descriptions, it is clear that the "mask layer" referred to in appended claim 1 may consist of various constituent parts. It may include a layer of irregular thickness, like layer 16 in FIG. 2B, formed prior to the etch procedure. The masking layer may also consist of or include particles which contribute to the formation of this layer during the etch procedure itself. Also, the "layer of irregular thickness" referred to in the appended claims may have various compositions depending on the materials and fabrication process of the probe tip. The layer could consist only of seed particles, or of particles deposited on the tip body after the probe fabrication process, or it could consist only of compounds formed spontaneously on the tip body, such as oxides formed on a TiN probe tip. The layer can be closed, so that none of the probe material is initially exposed to the plasma, but this probe material only becomes exposed when the mask layer is locally etched away. This necessarily occurs locally due to the irregular thickness of the layer. The layer of irregular thickness may also be a layer that exposes locally the underlying probe material from the start of the etch procedure, for example a layer consisting only of seed particles, with thickness zero in between the seed particles.

The etch procedures described above are stopped when the nanotips 15 have obtained a given shape and aspect ratio. In the case of the above-described $O_2$ plasma etch of a diamond tip, the $O_2$-etch duration defines the shape of the nanotips. At first, the nanotips are cone-shaped pillars, as illustrated in FIG. 3A. As the etch process is applied longer, the nanotips become more needle shaped, due to a slight isotropy of the dry etch process. The etch time can thus be controlled to obtain a given shape. When the etch process is stopped, portions of the seed particles and/or the $SiO_xC_y$ layer and/or of the sputtered particles may still be present on the nanotips. For some applications, these remnants of the etch mask are not a problem and they may remain. Otherwise, a slight oxygen over-etch may burn away these remnants, or when the tip is used in an electrical SPM measurement, the remnant may be removed by briefly applying a high bias voltage or a high scanning force.

The drawing in FIG. 3A is a schematic representation. In reality, the number of nanotips 15 may be higher and the nanotips may be distributed more randomly across the diamond surface. The dimensions of the nanotips are in the order of nanometers, for example a height of about 50 to 100 nm. The radius of the apex area of the nanotips ranges from less than 1 nm up to a few nanometer, which is comparable to or better than the radius of a standard pyramid-shaped tip, but the nanotips are considerably smaller and more pointed than the tip body 10 prior to the etch procedure. In other words, the aspect ratio of the nanotips 15 is much higher compared to the aspect ratio of the apex area of the tip body 10 prior to the etch procedure. The aspect ratio of the apex area may be determined by approximating the apex area as a spherical surface and determining the aspect ratio as the ratio of the average diameter of the surface to its height. The aspect ratio of the nanotips may be calculated according to generally established definitions in accordance with the shape of the nanotips, for example as the ratio of the average width of a cone-shaped tip to the height of the tip. An example method may thus provide a way to produce a probe with increased aspect ratio of the tip portion that is actually in contact with the surface, and without requiring complex micromachining or other fabrication methods. The etch process is self-aligned, and requires no lithographic mask other than the particles, $SiO_xC_y$ layer or other contributors to the mask layer referred to in appended claim 1.

When the probe tip illustrated in FIG. 3A is used for probing a sample by SPM, the nanotip that enters into contact with the sample may be the outermost nanotip on the top of the pyramid, or one of the tips adjacent to it, dependent on the angular position of the probe. This type of probe is therefore very suitable for use in combination with a tiltable SPM head, as is common. The fact that a plurality of nanotips 15 is present, ensures that at least one of these tips contacts the sample. The presence of multiple sharp nanotips also makes the probe tip suitable for scratching a surface and removing material from the surface, as applied for example in the standardized "scalpel AFM" technique. Another possible use of the tip produced herein and including multiple sharp nanotips is for attaching nano/micro objects such as biological cells to the sharp nano-tips. This is enabled by the understood fact that a plurality of closely spaced nano-tips are capable of influencing the wettability of a surface.

Figure 3B:
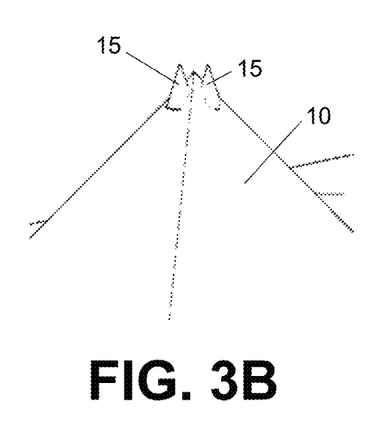
FIG. 3B illustrates a pyramid-shaped tip with a few nano-sized tip portions in the apex area of the tip body, according to example embodiments.
Figure 3C:
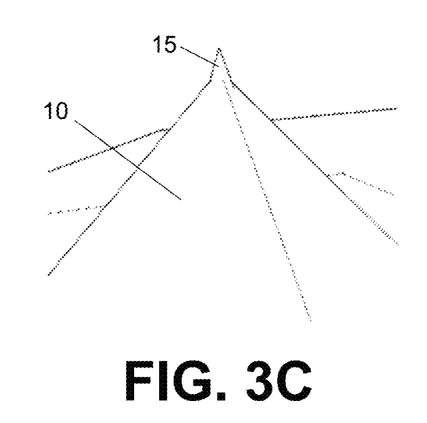
FIG. 3C illustrates a pyramid-shaped tip with only one nano-sized tip portion in the apex area of the tip body, according to example embodiments.

The disclosure is not limited to the "hedgehog" type structure described above. According to an embodiment, the dry etch process is continued until the nanotips 15 are etched away on the side planes of the pyramid. However, one or more nanotips 15 are nevertheless formed on the apex area of the tip body 10, as schematically illustrated in FIGS. 3B and 3C. This tip structure, referred to hereafter as the "tip-on-tip embodiment" may be obtained by exploiting one or more effects, possibly occurring simultaneously. In the case of the diamond-coated tip/silicon mold/Ni cantilever setup described above, the sputtering of Ni particles from the cantilever during the etch process is one effect that contributes to this type of tip structure. As stated above, the electric field generated by the ion bombardment is stronger where the surface is sharper, i.e. at the pyramid plane edges and mostly at the apex. The field attracts the Ni particles, so there are more etch mask particles at the apex than on the sidewalls. As a consequence, while the diamond layer on the sidewalls is completely etched away, one or more sharp diamond tips 15 remain on the apex region. After the etch procedure, the tip body is therefore entirely formed by Ni, except for the sharp diamond tips 15 in the apex area.

Figure 4:
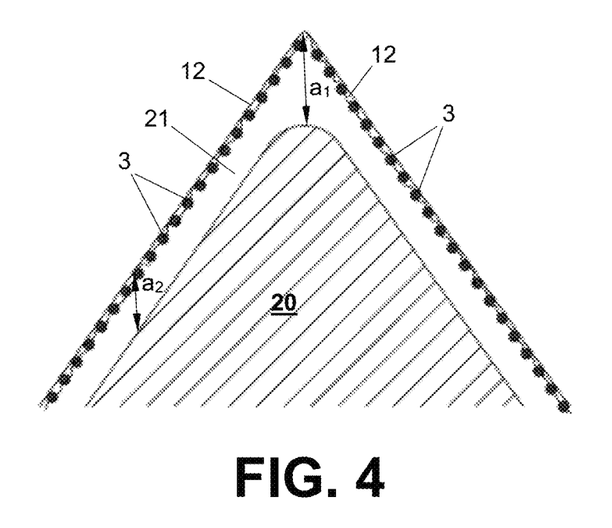
FIG. 4 illustrates a pyramid-shaped tip body having a thicker diamond layer on the apex area than on the side planes of the tip body, according to example embodiments.

A second contributor to this "tip on tip" embodiment is the fact that the diamond layer may be thicker near the apex region compared to on the side planes of the pyramid. This is illustrated in FIG. 4, which shows a cross-section of a diamond coated probe tip body, having a Ni core 20 and a doped diamond layer 21. FIG. 4 also shows schematically the presence of the non-doped diamond seed particles 3 and of the $SiO_xC_y$ layer 12. It is seen that the thickness of the diamond layer, as measured in the direction perpendicular to the ground plane of the pyramid, is larger at the apex region (thickness $a_1$) than on the sides of the pyramid (thickness $a_2$). This may be a consequence of the deposition process applied for forming the diamond layer. When the dry etching process is continued until the diamond layer 21 is removed from the sides of the pyramid, a substantial diamond thickness remains on the apex area, due to the difference in thickness between $a_1$ and $a_2$. This results in the appearance of one or more sharp tip portions 15 at the apex region only, as illustrated in FIGS. 3B and 3C. The number of tip portions appearing depends on the exact distribution of the particles near the apex region. This embodiment therefore provides a straightforward way of producing a "tip-on-tip" probe without requiring complex micromachining or other methods. The difference between the thicknesses $a_1$ and $a_2$ is not always occurring or may not be sufficient to obtain the above-described effect. It may depend on the average thickness of the layer 21 of the probe material (diamond or other), and/or on specific parameters applied when producing this layer.

The disclosure is applicable to the production of any type of probe suitable for SPM scanning, produced by any standard technique and formed of any standard material, for example Si and Si-compound tips or metal and metal alloy tips. The method is equally applicable to diamond tips other than boron-doped diamond tips, for example phosphor-doped diamond, non-doped diamond, NV (Nitrogen Vacancy) diamond. A "hedgehog" probe tip including nanotips 15 formed of TiN on a Ni cantilever may be produced. The probe was fabricated by a molding technique similar to the methods described above. However instead of a diamond CVD layer, a TiN layer, about 150 nm thick was deposited in the Si mold by sputtering of TiN. No seed particles were deposited in the mold. The layer of irregular thickness formed on the TiN is initially an oxide layer that spontaneously forms on the outer surface of the TiN pyramid, after its release from the mold. The oxide works as an etch mask in a plasma etch process under mixed $SF_6/O_2$ atmosphere, in the same way as the combined effect of the seed particles and $SiO_xC_y$ described above, i.e. the oxide is slowly etched, so that the TiN layer underneath is locally exposed and subsequently etched at a faster rate. As the etch process progresses, sputtered Ni particles contribute to the mask layer, equally as described above. Exposure of the tip to a plasma etch under this atmosphere thereby produced the "hedgehog" structure with TiN nanotips 15. Details of suitable etch parameters are provide further in this description.

Figure 5A:
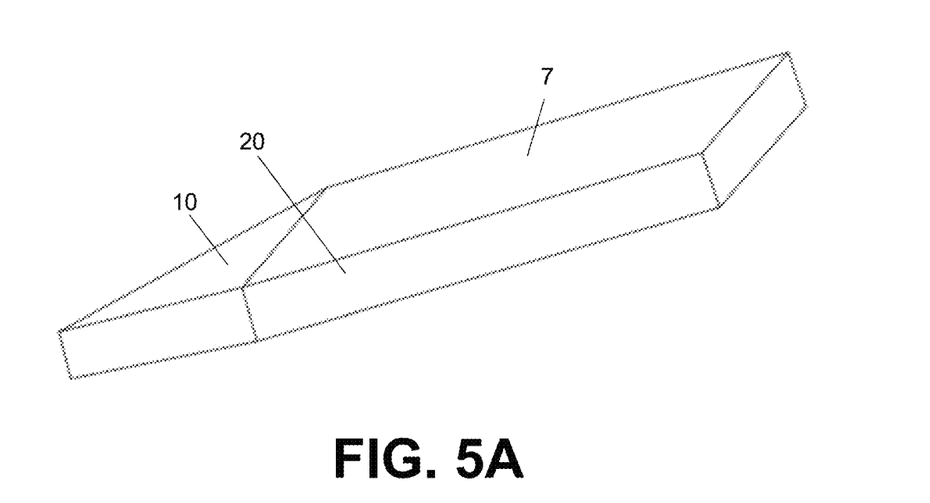
FIG. 5A illustrates how example methods may be applied to an in-plane probe, according to example embodiments.
Figure 5B:
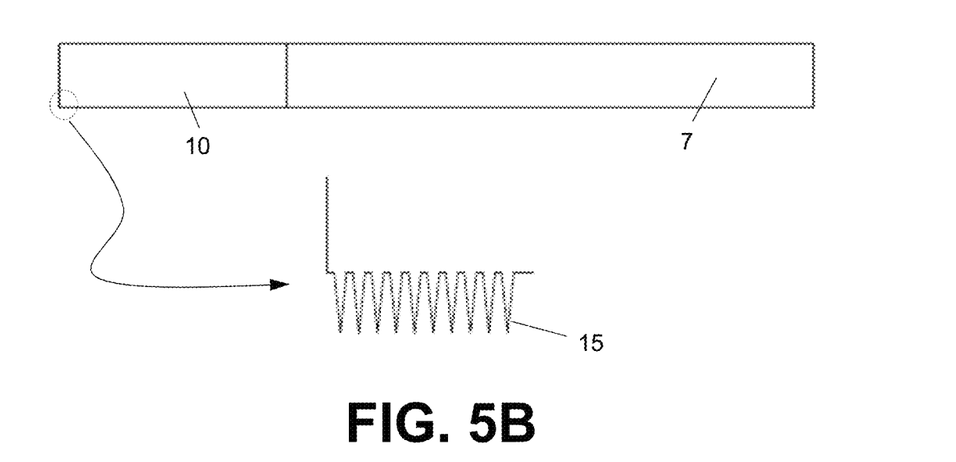
FIG. 5B illustrates how example methods may be applied to an in-plane probe, according to example embodiments.

The disclosure is not limited to pyramid-shaped tips. The nanotips 15 may be produced on other tip geometries as well. FIG. 5A illustrates an in-plane probe as in, for example, U.S. Pat. No. 8,484,761. The image shows the cantilever 7 with a diamond tip body 10 extending outward from the cantilever and lying in the plane of the cantilever. FIG. 5B shows the same probe in a side view and a detail of the tip area, after applying the etch procedure in accordance with example embodiments. The nanotips 15 extend in the direction perpendicular to the plane of the cantilever 7 and the tip body 10. Particles having the above-described mask effect may be deposited in a separate deposition step, and/or if the cantilever material is suitable for this purpose, masking particles may be deposited during the etching step itself, by sputtering of the cantilever material, and/or of material inside the etch chamber, and/or by the masking effect of etch residues.

A number of additional method steps may be performed after completion of the method according to any of the embodiments described above. These additional method steps include:

Deposition of a capping layer on the one or more nanotips 15, thereby covering the nanotips completely with the capping layer, Plasma etching the capping layer so as to remove the capping layer from a tip area of the nanotips, while maintaining the capping layer on the lateral surface of the nanotips. The tip area includes at least the apex of the nanotips.

In other words, after these additional steps, the capping layer forms a sleeve around the nanotips 15, leaving the apex of the nanotips exposed, so that the function of the nanotips in an SPM apparatus or other application is not inhibited. The capping layer reinforces the nanotips, i.e. it increases the mechanical resistance of the nanotips, while the tips remain capable of performing their function. This embodiment is beneficial especially in high-force applications, where the capping layer helps to protect the nanotips from breaking off. On a diamond tip or diamond coated tip as described above, the capping layer may be an $SiO_x$ layer ($1<x<2$) deposited on a hedgehog type probe tip as shown in FIG. 3A or on a "tip-on-tip" probe tip as shown in FIGS. 3B and 3C. The $SiO_x$ layer may be deposited by plasma-enhanced chemical vapor deposition (PECVD). The thickness of the $SiO_x$ layer may be in the order of a few tens of nanometer, e.g. about 50 nm. The etch process for removing the $SiO_x$ layer from the apex area may be a plasma etch using a mixture of $SF_6$ and $O_2$. The etch process is stopped when at least the apex of the nanotips is exposed. A more detailed description of suitable parameters is described further in this description.

The additional steps as described in the previous paragraphs, for producing a capping layer on the one or more nanotips 15, can be applied also on a "tip-on-tip" probe, i.e. a probe tip including nanotips on the apex area of the tip body, but wherein the nanotips are produced by a method other than the above-described method involving the production of these nanotips by a self-aligned etch process. For example, the capping layer may be produced by the same steps as described above, on a probe tip produced by the method described in document U.S. Pat. No. 6,328,902. The present disclosure is therefore equally related to a method for producing a probe tip suitable for scanning probe microscopy (SPM), including the steps of:

Producing a probe tip body 10 including an apex area and including on the apex area one or more tip portions being considerably smaller and more pointed than the tip body, while no tip portions are present on the remainder of the probe tip body, Depositing a capping layer on the one or more tip portions 15, thereby covering the tip portion or portions entirely, Subjecting the tip portions 15 to a plasma etch process, configured to remove the capping layer from a tip area of the one or more tip portions, the tip area including the apex of the one or more tip portions, while substantially maintaining the cap layer around the lateral surface of the one or more tip portions 15.

In view of the foregoing paragraphs, the disclosure is equally related to a probe tip suitable for scanning probe microscopy (SPM), including a probe tip body having an apex area and including one or more tip portions on the apex area of the tip body, and no tip portions on the remainder of the tip body, the tip portions being considerably smaller and more pointed than the tip body, wherein the tip portions include a capping layer on their outer surface except on a tip area of the tip portions, the tip area including the apex of the tip portions.

The example of suitable parameters for producing a capping layer described in the following section is applicable to a diamond probe tip of the "tip on tip" type, produced by the self-aligned etch method, by the method of U.S. Pat. No. 6,328,902 or by any other understood method.

Examples—Experiments

A diamond "full hedgehog" tip on a probe was produced that includes a tip body produced by the above-described molding technique: Si mold, non-doped seed particles deposited in the mold (density about $1E10/cm^2$), Ni cantilever, diamond layer (about 800 nm thick) on Ni core. The following etch parameters were applied:

TABLE 1

| | |
|---|---|
| Plasma reactor type | ICP |
| Plasma gas | $O_2$ |
| Gas flow (of plasma gas) | 50 sccm* |
| RF power | 25 W |
| ICP power | 1200 W |
| Chamber pressure | 9 mTorr ** |
| Etch duration | 2.5 min |

*the gas flow was supplied at 294K and 3 atm. Under these conditions 1 sccm equals about $9.09E-9$ m$^3$/s.
** 1 Torr = 133,322 Pa A diamond "tip on tip" probe as shown in FIG. 3C was produced on a probe tip produced by the same method, in the same ICP reactor, applying the same RF and ICP power and same chamber pressure, but by the following sequence of etch steps:

1. 20 s mixed $O_2/SF_6$ plasma etch; gas flows 50 sccm (02) and 2.5 sccm ($SF_6$)
2. 5 min $O_2$ plasma etch; $O_2$ flow 50 sccm The TiN full hedgehog tip referred to above was produced by the following etch conditions:

TABLE 2

| | |
|---|---|
| Plasma reactor type | ICP |
| Plasma gas | Mixed $SF_6/O_2$ |
| Gas flow (of plasma gas) | 40 sccm ($SF_6$)/10 sccm ($O_2$)* |
| RF power | 50 W |
| ICP power | 300 W |
| Chamber pressure | 10 mTorr |
| Etch duration | 5 min |

*the gas flow was supplied at 294K and 3 atm

On a "full hedgehog" tip with diamond tips obtainable by the parameters of table 1, a $SiO_x$ layer was deposited by PECVD, with a thickness of about 50 nm. The tip was subsequently subjected to an $SF_6/O_2$ plasma etch with the parameters shown in Table 3.

TABLE 3

| | |
|---|---|
| Plasma reactor type | ICP |
| Plasma gas | Mixed $SF_6/O_2$ |
| Gas flow (of plasma gas) | 2.5 sccm ($SF_6$)/50 sccm ($O_2$)* |
| RF power | 25 W |
| ICP power | 1200 W |
| Chamber pressure | 10 mTorr |
| Etch duration | 5 min |

*the gas flow was supplied at 294K and 3 atm.

The result was that the $SiO_x$ layer was removed from the apex of the nanotips, while forming a reinforcing capping layer around the lateral surface of the nanotips.

While example embodiments have been illustrated and described in detail in the drawings and foregoing description, such illustration and description are to be considered illustrative and not restrictive. Other variations to the disclosed embodiments can be understood and effected in

What is claimed is:

1. A method for producing a probe tip suitable for scanning probe microscopy (SPM), comprising:
producing a probe tip body comprising at least an outer layer of a probe material, the probe tip body comprising an apex area;
during the production of the probe tip body or after the production, forming a mask layer on the outer layer of probe material; and
subjecting the probe tip body to a plasma etch procedure, wherein the mask layer acts as an etch mask for the plasma etch procedure, wherein the plasma etch procedure and the etch mask are configured to produce one or more tip portions formed of the probe material, and wherein each one of the one or more tip portions is smaller and has a higher aspect ratio than the apex area of the probe tip body prior to the plasma etch procedure,
wherein the mask layer comprises a layer of irregular thickness formed prior to the plasma etch procedure, wherein the layer of irregular thickness acts as the etch mask for the plasma etch procedure, wherein the probe tip body is produced by producing a mold in a substrate and by depositing the probe material in the mold, and wherein at least one of: (i) seed particles are deposited in the mold prior to depositing the probe material therein and wherein the layer of irregular thickness comprises the seed particles, or (ii) the layer of irregular thickness comprises compounds formed spontaneously on a surface of the probe tip body after the production of the probe tip body and prior to the plasma etch procedure.

2. The method according to claim 1, wherein the layer of irregular thickness further comprises compounds formed spontaneously on a surface of the mold.

3. The method according to claim 1, wherein the plasma etch procedure comprises:
a first etch process performed during a first etch time and configured to produce craters in the layer of irregular thickness; and
a second etch process performed during a second etch time that is longer than the first etch time and configured to produce the one or more tip portions.

4. The method according to claim 1, wherein the probe tip body is attached to a cantilever, wherein particles of the cantilever are sputtered during the plasma etch procedure and deposited onto the probe tip body, and wherein the sputtered particles of the cantilever contribute to the formation of the mask layer during a remainder of the plasma etch procedure.

5. The method according to claim 1, wherein at an end of the plasma etch procedure, the one or more tip portions are distributed across a totality of the probe tip body.

6. The method according to claim 1, wherein the probe tip body is pyramid-shaped, and wherein, at an end of the plasma etch procedure, the one or more tip portions are present on an apex area of the probe tip body and no tip portions are present on side planes of the probe tip body because:
a higher concentration of masking particles is deposited on the apex area than on the side planes during the plasma etch procedure; or
the probe tip body comprises a core and, on the core, a layer of the probe material, wherein a thickness of the layer of the probe material is higher on the apex area than on the side planes such that, at the end of the plasma etch procedure, the probe material is removed from the side planes.

7. The method according to claim 1, wherein the probe material is diamond.

8. The method according to claim 1, further comprising the following steps performed after the plasma etch procedure:
depositing a capping layer on the one or more tip portions, thereby covering the one or more tip portions entirely; and
subjecting the one or more tip portions to an additional plasma etch process configured to remove the capping layer from a tip area of the one or more tip portions, while substantially maintaining the capping layer around a lateral surface of the one or more tip portions, wherein the tip area includes apexes of the one or more tip portions.

9. A probe tip suitable for scanning probe microscopy (SPM), comprising a probe tip body comprising at least an outer layer of a probe material and having an apex area, wherein a plurality of tip portions formed of the probe material are distributed across a totality of the probe tip body, wherein each of the tip portions is smaller and has a higher aspect ratio than the apex area of the probe tip body, wherein the tip portions comprise a capping layer on their outer surface except on a tip area of the tip portions, and wherein the tip area comprises an apex of the tip portions.

10. A probe comprising:
a cantilever;
a holder to which the cantilever is attached; and
a probe tip attached to a distal end of the cantilever, wherein the probe tip is suitable for scanning probe microscopy (SPM) and comprises a probe tip body comprising at least an outer layer of a probe material and having an apex area, wherein a plurality of tip portions formed of the probe material are distributed across a totality of the probe tip body, wherein each of the tip portions is smaller and has a higher aspect ratio than the apex area of the probe tip body, wherein the tip portions comprise a capping layer on their outer surface except on a tip area of the tip portions, and wherein the tip area comprises an apex of the tip portions.

* * * * *